(12) United States Patent
Pickerd et al.

(10) Patent No.: US 10,097,222 B2
(45) Date of Patent: Oct. 9, 2018

(54) VARIABLE PASSIVE NETWORK NOISE FILTER FOR NOISE REDUCTION

(71) Applicant: Tektronix, Inc., Beaverton, OR (US)

(72) Inventors: John J. Pickerd, Hillsboro, OR (US); Pirooz Hojabri, San Jose, CA (US)

(73) Assignee: Tektronix, Inc., Beaverton, OR (US)

( * ) Notice: Subject to any disclaimer, the term of this patent is extended or adjusted under 35 U.S.C. 154(b) by 0 days.

(21) Appl. No.: 15/721,591

(22) Filed: Sep. 29, 2017

(65) Prior Publication Data

US 2018/0123626 A1   May 3, 2018

Related U.S. Application Data

(60) Provisional application No. 62/414,455, filed on Oct. 28, 2016.

(51) Int. Cl.
| | |
|---|---|
| *H03H 7/46* | (2006.01) |
| *H04B 17/30* | (2015.01) |
| *H04B 1/10* | (2006.01) |
| *H04B 1/00* | (2006.01) |
| *H04B 1/04* | (2006.01) |
| *G01R 13/02* | (2006.01) |
| *H04B 10/67* | (2013.01) |

(52) U.S. Cl.
CPC ....... *H04B 1/1018* (2013.01); *G01R 13/0272* (2013.01); *H04B 1/0057* (2013.01); *H04B 1/0475* (2013.01); *H04B 10/674* (2013.01)

(58) Field of Classification Search
CPC .......... H04B 1/00; H04B 1/0057; H04B 1/10; H04B 1/1027; H04B 1/12; H04B 1/16; H04B 1/40; H04B 1/401; H04B 17/00; H04B 17/30; H03H 7/00; H03H 7/46; H03H 7/463; H03H 7/468
See application file for complete search history.

(56) References Cited

U.S. PATENT DOCUMENTS

| | | | | |
|---|---|---|---|---|
| 5,738,525 | A * | 4/1998 | Davies | G09B 9/00 333/166 |
| 7,683,732 | B1 * | 3/2010 | Blumenkranz | H04B 3/14 333/18 |
| 2008/0102751 | A1 * | 5/2008 | Cavanagh | H04H 20/74 455/12.1 |
| 2009/0052901 | A1 * | 2/2009 | Cagle | H04B 10/2504 398/116 |
| 2010/0142606 | A1 * | 6/2010 | Kato | H04B 3/14 375/232 |

FOREIGN PATENT DOCUMENTS

JP              2503904 B2 *  7/1993   ............. H03H 11/04

* cited by examiner

*Primary Examiner* — Blane Jackson
(74) *Attorney, Agent, or Firm* — Marger Johnson; Kevin D. Dothager (57) ABSTRACT

Disclosed is a noise filter. The noise filter includes an input port to receive an analog signal. The noise filter further includes a multiplexer coupled to the input port. The multiplexer separates the analog signal into a plurality of frequency bands. The frequency bands include a high frequency band and a low frequency band. The noise filter also includes a low-band variable attenuator coupled to the multiplexer. The low-band variable attenuator adjustably attenuates the low frequency band relative to the high frequency band.

20 Claims, 9 Drawing Sheets

VARIABLE PASSIVE NETWORK NOISE FILTER FOR NOISE REDUCTION

CROSS-REFERENCES TO RELATED APPLICATIONS

The present application claims benefit from U.S. Provisional Patent Application Ser. No. 62/414,455, filed Oct. 28, 2016 by John J. Pickerd et al., and entitled "CTLE Variable Passive Network For Noise Reduction," which is incorporated herein by reference as if reproduced in its entirety.

FIELD OF THE INVENTION

This disclosure is directed to systems and methods associated with aspects of a test and measurement system, and, more particularly, to systems and methods for controlling noise, such as frequency attenuation in the test and measurement system.

BACKGROUND

Test and measurement systems are designed to receive signal inputs, e.g. from a Device Under Test (DUT), sample the signals, and display the result as a waveform. The signal inputs may be received via a link, e.g. a signal connection, a communication(s) link, input port or the like. Links may cause varying amounts of signal loss, depending on the physical characteristics of the link. Signal loss is the gradual loss of signal intensity (e.g. amplitude) during propagation through a medium. When signal loss is constant over distance for any type of signal propagated over the link, an amplifier can be employed to boost the gain of the signal and overcome the loss. However, signal loss may also vary depending on the frequency of the signal. For example, high frequency signals may suffer from significantly more signal loss than low frequency signals. In such a case, an amplifier may partially correct for the high frequency loss, but will also boost high frequency signal noise.

Examples in the disclosure address these and other issues.

BRIEF DESCRIPTION OF THE DRAWINGS

Aspects, features and advantages of embodiments of the present disclosure will become apparent from the following description of embodiments in reference to the appended drawings in which.

DETAILED DESCRIPTION

In processing the signal can experience various kinds of noise. One of these kinds of noise can be referred to as attenuation experienced by the signal, which can be described in terms of a frequency loss response. The frequency response may be defined by a transfer function having multiple poles and or zeros. Ideally, components could provide an inverse of the frequency loss response to the signal in order to de-embed the effects of the processing of the signal. However, a DUT may include an infinite number of potential attenuation responses (e.g., based on link loss, bandwidth constraints of a specified signal standard, etc.).

Examples of the disclosed subject matter include a test and measurement system configured to employ a noise filter that can apply an approximate a frequency loss response to one or more frequency bands of a signal to effectively attenuate the one or more frequency bands (e.g., a low frequency band) in a similar manner to that experienced by another frequency band (e.g., a high frequency band). As used herein, the terms high and low in reference to a frequency band connote a relative difference between the frequency bands. To put it another way, a high frequency band of a signal includes a higher frequency portion of a signal while a lower frequency band of the signal includes a lower frequency portion of the signal. The noise filter can be implemented in an oscilloscope and/or in a stand-alone unit coupled to an oscilloscope or similar test and measurement device. The noise filter includes a multiplexer that separates an input signal into a plurality of frequency bands (e.g. a high frequency band, one or more optional mid-frequency bands, a low frequency band, etc.). The bands are forwarded to corresponding channels for independent processing of the individual bands. Various ones of the channels contain corresponding attenuators. The attenuator(s) are configured to attenuate the bands on a channel by channel basis to match an attenuation experienced by another band. For example, if the high frequency band experiences attenuation due to, for example, a DUT link, then the low frequency band can include an attenuator that attenuates the low frequency band to match the attenuation experienced by the high frequency band. This can enable the entire frequency range of the input signal to be attenuated in a similar manner. While this disclosure can work equally well for any signal band that is experiencing attenuation due to processing, for ease of description the examples herein are formulated such that the high frequency band is the band experiencing attenuation as is typically the case. Accordingly, the attenuators can scale the low frequency band relative to the high frequency band to mitigate an effect of signal loss experienced by the portion of the signal included in the high frequency band. A controller can also be included to control the amount of attenuation provided by the attenuators. A delay circuit can be positioned in the high frequency channel to account for delay caused by the variable attenuator. The delay circuit is configured to match a delay caused by the variable attenuator(s) to mitigate signal skew (e.g. mitigate signal mismatch caused different signal path speeds). The delay circuit may be fixed or may be controlled by the controller to temporally align the high band with the attenuated band(s). The frequency bands may be forwarded to the oscilloscope as individual bands on multiple channels for testing. In other aspects, the frequency bands may be recombined by a combiner before being forwarded to the oscilloscope. The system provides a coarse approximation of an frequency response of the DUT/DUT link. Further, the system is passive and does not employ amplifiers for the attenuation compensation, which would add noise during amplification. Hence the system is tunable and can reduce noise added to the signal as compared with active forms of attenuation compensation by helping to compensate for the attenuation of the signal. The attenuation employed for the corresponding bands may be determined based on scattering (S) parameters. The attenuation to be employed may also be determined by acquiring each band individually at each possible attenuator setting and selecting the settings providing the highest signal-to-noise ratio (SNR) at the oscilloscope.

Figure 1:
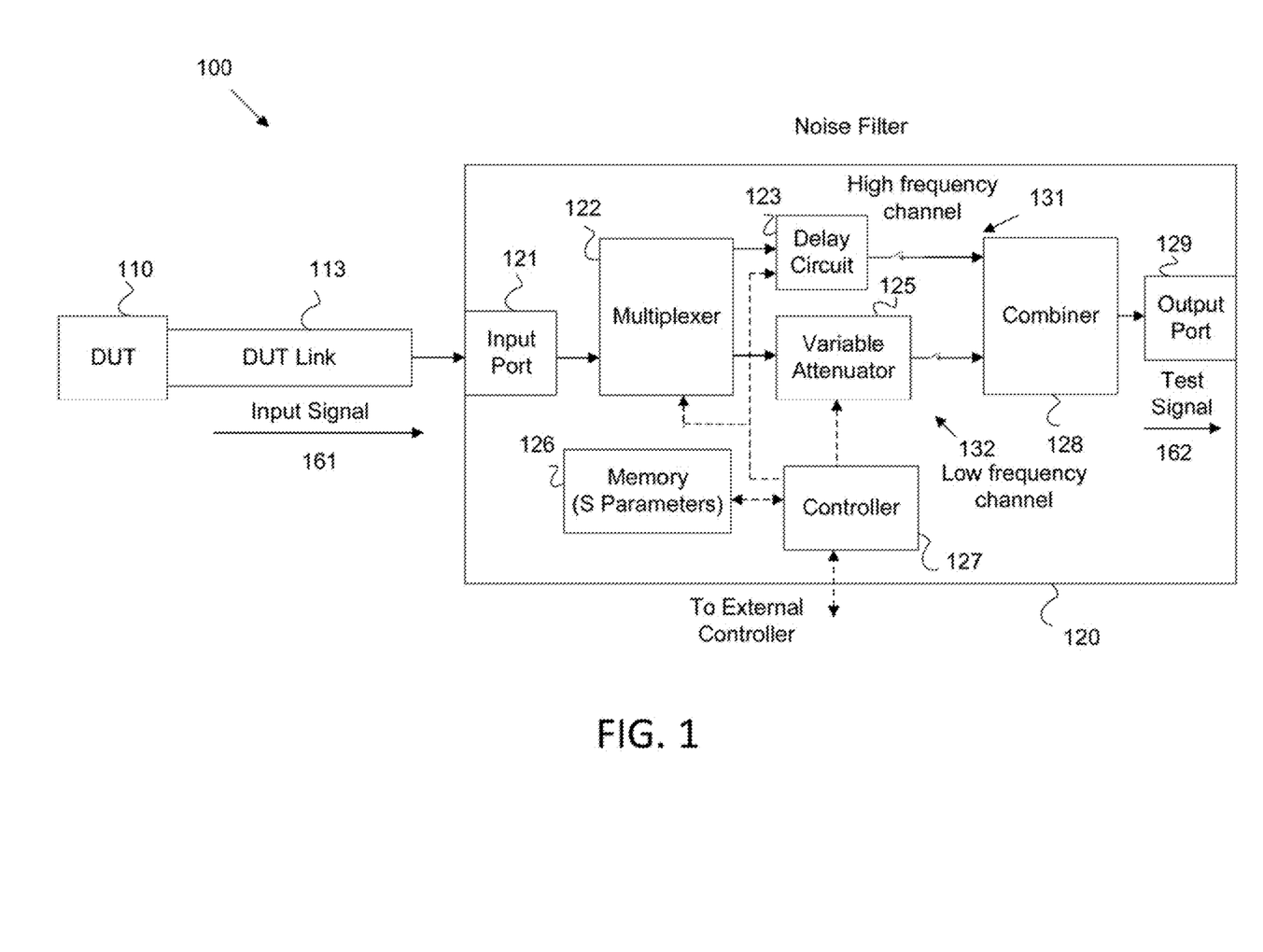
FIG. 1 is a block diagram of an example test and measurement system including a noise filter in accordance with various aspects of the present disclosure.

FIG. 1 is a block diagram of an example test and measurement system 100 including a noise filter 120 in accordance with various aspects of the present disclosure. The system 100 includes a DUT 110 coupled to a noise filter 120, which outputs a signal to an oscilloscope, such as oscilloscope 230 shown in FIG. 2 below, for testing and display to a user. The noise filter 120 may be, for example, a passive continuous time linear equalizer (CTLE) filter.

The DUT 110 may be any signal source configured to communicate via electrical signals. For example, DUT 110 may include a transmitter configured to transmit signals over an electrically conductive medium. In some cases, DUT 110 is a device designed to transmit signals to a corresponding receiver (not shown). The DUT 110 may be coupled to the oscilloscope, via the noise filter 120, for testing purposes, for example when the DUT 110 is believed to be engaged in transmitting faulty signals and/or for verification of signaling accuracy for a newly designed DUT 110. DUT 110 is connected to the noise filter 120 via DUT link 113. The DUT link 113 may be, or include, any electrically conductive medium capable of communicating signals from the DUT 110 to the noise filter 120. For example, the DUT link 113 may employ electrically conductive wire, signal probes, intervening test equipment, etc. In many cases, a DUT link 113 can be one cause of attenuation of an input signal 161. Attenuation can be considered a gradual loss of amplitude of a signal while passing through a medium. In addition, attenuation is not uniform across the frequency range of the signal. As such, the attenuation can impact one range of frequencies more than another. In this way, the attenuation can be referred to as frequency specific. For example, high frequency portions of a signal (e.g. frequencies in excess of 100 megahertz (MHz)) may suffer from greater attenuation than lower frequency portions of the signal (e.g. frequencies less than 100 MHz). The input signal 161 may be any electrical test signal from the DUT 110. The input signal 161 may be, for example, an analog signal.

The noise filter 120 can be configured to account for such attenuation by attenuating those portions of the signal that were not subject to the attenuation. The noise filter 120 contains an input port 121. The input port 121 can be any electrical component configured to receive an input signal, such as, for example, a plug for receiving a signal probe. The input port 121 may then forward the input signal 161 to a multiplexer 122. As used herein, a multiplexer refers to a multiband splitter that is capable of splitting a signal into more than one frequency band.

As depicted, the multiplexer 122 is coupled to the input port 121. The multiplexer 122 is a passive device that implements frequency domain multiplexing. The multiplexer 122 may convert a signal, such as input signal 161, with a broad range of frequencies into two or more signal bands with different frequency ranges. In some instances, the frequency ranges can be mutually exclusive. A multiplexer 122 that converts a signal into two frequency bands may be referred to as a diplexer, a multiplexer that converts a signal into three frequency bands may be referred to as a triplexer, etc. For example, the multiplexer 122 is configured to separate the input signal into a plurality of frequency bands including a high frequency band and a low frequency band. The high frequency band and the low frequency band may then be forwarded along a high frequency channel 131 and a low frequency channel 132, respectively. The high frequency signal band employs different frequency bounds than the low frequency signal band. The multiplexer 122 may be configured with an adjustable cross-over frequency, or may be implemented with a fixed cross-over frequency. Signal bands with frequencies above the cross-over frequency are forwarded to the high frequency channel 131 and signal bands with frequencies below the cross-over frequency are forwarded to the low frequency channel 132. Accordingly, a high frequency band is a band of input signal 161 that contains waveforms with frequencies above the multiplexer 122 cross-over frequency, and the low frequency band is a band of input signal 161 that contains waveforms with frequencies below the multiplexer 122 cross-over frequency, respectively. The multiplexer 122 may be implemented from various circuitry such as lumped elements, transmission line stubs, Yttrium iron garnet (YIG) with variable crossover, traveling wave filters, or other circuitry. The crossover may, merely for example, be nominally set at about −6 decibels (dB). The magnitude level, as a function of frequency in each band, may be nominally flat at about 0 dB, and decrease at the ends of the band to the about −6 dB at the crossover frequency.

The low frequency channel 132 contains a variable attenuator 125. The variable attenuator 125 in the low frequency channel 132 may be referred to as a low-band variable attenuator, for example to distinguish from a midband variable attenuator as discussed below. The variable attenuator 125 is any component configured to controllably attenuate a signal, for example based on a control signal from a controller 127. The low-band variable attenuator 125 may be coupled to the multiplexer 122 to adjustably attenuate the low frequency band (e.g. in the low frequency channel 132) relative to the high frequency band (e.g. in the high frequency channel 131) to mitigate attenuation in the input signal 161 associated with the DUT link 113. In other words, the variable attenuator 125 may reduce the intensity of the low frequency band to match any loss of intensity in the high frequency band caused by the DUT link 113.

The high frequency channel 131 conducts the high frequency band. The noise filter 120 is designed to attenuate the low frequency band to match the attenuation in the high frequency band caused, for example, by the components of DUT link 113. As such, the high frequency band may not be attenuated further. As such, the high frequency channel 131 may not include a variable attenuator. It should be noted that this does not prevent the inclusion of an attenuator in the high frequency channel 131 when desired for particular applications. However, the low-band variable attenuator 125 may cause some signal delay in the low frequency band.

Accordingly, a delay circuit 123 can be positioned in the high frequency channel 131. The delay circuit 123 can be configured to temporally align the high frequency band with the low frequency band prior to recombination into a single test signal. In other words, the delay circuit 123 matches the delay of the variable attenuator 125 to prevent signal skew (e.g. ensure corresponding portions of the multiplexed bands reach the combiner 128 at the same time). The delay may be fixed, or the delay may be variable to allow calibration to a value as close as possible to a temporal match prior to a digital signal processor (DSP) correction of delay (e.g. in an oscilloscope). For example, the delay circuit may include a specified length of cable and/or strip line such that the group delay of the high frequency band is equal to the delay of the low frequency band (e.g. and/or any mid-frequency band(s)). It should be noted that exactly matching the frequency band group delays may not be a requirement. For example, S-parameters of the system may be employed for the purpose of computing a correction filter to correct both the phase and the magnitude of the frequencies in all bands after the signal is reconstructed (e.g. at combiner 128 and/or at an oscilloscope).

As depicted, the noise filter 120 can also include a combiner 128 coupled to the low frequency channel 132 and the high frequency channel 131. The combiner 128 is any device containing circuitry to combine a plurality of signals together to make a version of the original input signal 161, but with the low frequencies attenuated with respect to the high frequencies. Specifically, the combiner 128 is configured to re-combine the plurality of frequency bands into a single test signal for sampling by a test and measurement instrument, such as an oscilloscope. The combiner 128 receives the low frequency band that has been attenuated to match the high frequency band. The combiner 128 also received the high frequency band that was attenuated, for example, by DUT link 113 and has been delayed to temporally match the low frequency band. By combining the bands, a test signal 162 based on the input signal 161 is generated. The test signal 162 is substantially similar to the input signal 161, but the attenuation caused by the DUT link 113 has been essentially distributed. The test signal 162 can then be amplified at the oscilloscope as desired for sampling purposes (e.g. to correct for the attenuation by the noise filter 120 and the DUT link 113). The noise filter 120 also includes an output port 129 that is configured to be coupled with a test and measurement device, such as, for example, an oscilloscope. In some instances, the variable attenuator can also be configured to take into account a link between the noise filter and the test and measurement device. The test signal 162 is forwarded over the output port 129 for sampling, acquisition, and/or display to a user via an oscilloscope or other test and measurement system.

The noise filter 120 may also include a controller 127. The controller 127 may be coupled to the multiplexer 122, the delay circuit 123, and the low-band variable attenuator 125. The controller 127 communication lines are depicted as dashed lines to indicate the flow of control commands, while solid lines are employed to indicate the flow of signal data. The controller may be any device configured to control the components in the noise filter 120. For example, the controller 127 may include one or more of a processor, an application specific integrated circuit (ASIC), a Field Programmable Gate Array (FPGA), a DSP, etc. The controller 127 is configured to execute instructions from a memory, such as memory 126 and/or implement any methods discussed herein, such as method 700 as described in detail below. The controller 127 may receive commands from an external controller, for example from a controller in an oscilloscope. The controller 127 may also receive commands from a user via a user interface. The controller 127 controls the components of noise filter 120 by transmitting corresponding commands to implement the noise filter 120 functionality as discussed herein. For example, the controller 127 may select settings for the low-band variable attenuator 125 based on characteristics of the input signal 161 (e.g. as determined by an oscilloscope and commanded by an external controller). As a specific example, the controller 127 may select an attenuation for the low-band variable attenuator 125 according to samplings of the test signal 162 (e.g. received and tested at an oscilloscope). Such samplings may be taken at a plurality of low-band variable attenuator 125 settings. The attenuation may be selected as the low-band variable attenuator 125 setting with a highest signal-to-noise ratio for the test signal 162. In other instances various control systems methodology could be implemented to improve the signal-to-noise ratio (e.g., adjust attenuation settings and/or crossover settings until the signal-to-noise ratio begins to decrease and then dial the settings back to achieve the previously highest signal-to-noise ratio.

In some instances, the controller 127 may control switches in the channels to allow only the high frequency band to pass and/or only the low frequency band to pass. The controller 127 may allow only the high frequency band to pass for sampling. The controller 127 may then allow only the low frequency band to pass and may iteratively apply low-band variable attenuator 125 settings. The oscilloscope may indicate the attenuator setting resulting in the highest signal-to-noise ratio. The controller 127 may then select the indicated attenuator setting. The controller 127 may also control the multiplexer 122 to select the cross-over frequency between the high frequency band and the low frequency band. The controller 127 may also control the delay circuit 123 to adjust the delay and hence control the removal of signal skew. The controller 127 may also employ commands to transfer S-parameter sets from an external system into memory 126. The controller 127 may also employ commands to transfer S-parameters for current attenuator setting(s) from memory 126 back to an external controller in an oscilloscope.

In some embodiments, the noise filter 120 may be configured to employ serial data link analysis (SDLA). SDLA de-embeds the effects of testing components from a test signal 162 to provide a more accurate representation of the signal obtained from the DUT. SDLA employs S-parameters to determine signal modifications to be made to the test signal 162 to de-embed the corresponding components. The noise filter 120 may comprise a memory 126 to store the S-parameters. The memory 126 may also act as a non-transitory medium for storing instructions for the controller 126. In some examples, the controller 127 may select an attenuation for the low-band variable attenuator 125 based on the S-parameters. In some examples, the memory 126 may be a non-volatile memory for storing the S-parameters for the input port 121 and output port 129. Further, a set of S-parameters may be available for each possible combination of attenuator 125 settings. An external system may measure the S-parameters for each attenuator 125 setting during manufacturing, and then store such S-parameters in the non-volatile memory. During use, an external controller (e.g. in the oscilloscope) may set the attenuator 125 to a desired or requested setting via the controller 127. The external controller may then read the S-parameters from the memory 126 for the corresponding setting. The memory 126 may also include other information such as model and serial number. Other calibration data may also be stored in memory 126, such as temperature related scale factors.

It should be noted that when two bands are employed, the variable attenuator 125 is applied to the low band, when three or more bands are employed a variable attenuator can be applied to the low band and the mid band, etc. An attenuator may not be placed in the high band unless desired for a particular application. In such a case, the noise filter 120 may further, or alternatively, include a high-band variable attenuator in the high frequency channel 131, coupled to the multiplexer 122, to adjustably attenuate the high frequency band.

Further, an alternative configuration of the present disclosure may omit controller 127 in favor of manually adjusted attenuators. In such a case, associated S-parameters for each setting of the attenuator(s) are managed by a user. In some cases, the attenuator(s) may employ fixed steps, for example steps of 1 dB. This approach may support maintaining a manageable number of S-parameter data sets while still meeting a goal of optimizing the signal-to-noise ratio when used in a noise reduction system.

As described above, the noise filter 120 implements a mechanism of splitting the frequency bands and then employing a variable attenuator 125 to control the level of the low frequency band with respect to the level of the high frequency band. Noise filter 120 can, in some embodiments, provide an approximation of any attenuation loss by providing a boost of high frequencies with respect to low frequencies. This may be employed in conjunction with systems that apply an inverse noise filter in a digital signal processor (DSP) after the test signal 162 is acquired by an oscilloscope. The noise filter 120 reduces noise added by the oscilloscope channel without affecting the signal noise included in the original input signal 161 from the DUT 110. This can be done, at least in part, by implementing uniform, or substantially uniform, attenuation across the frequencies of a signal.

Figure 2:
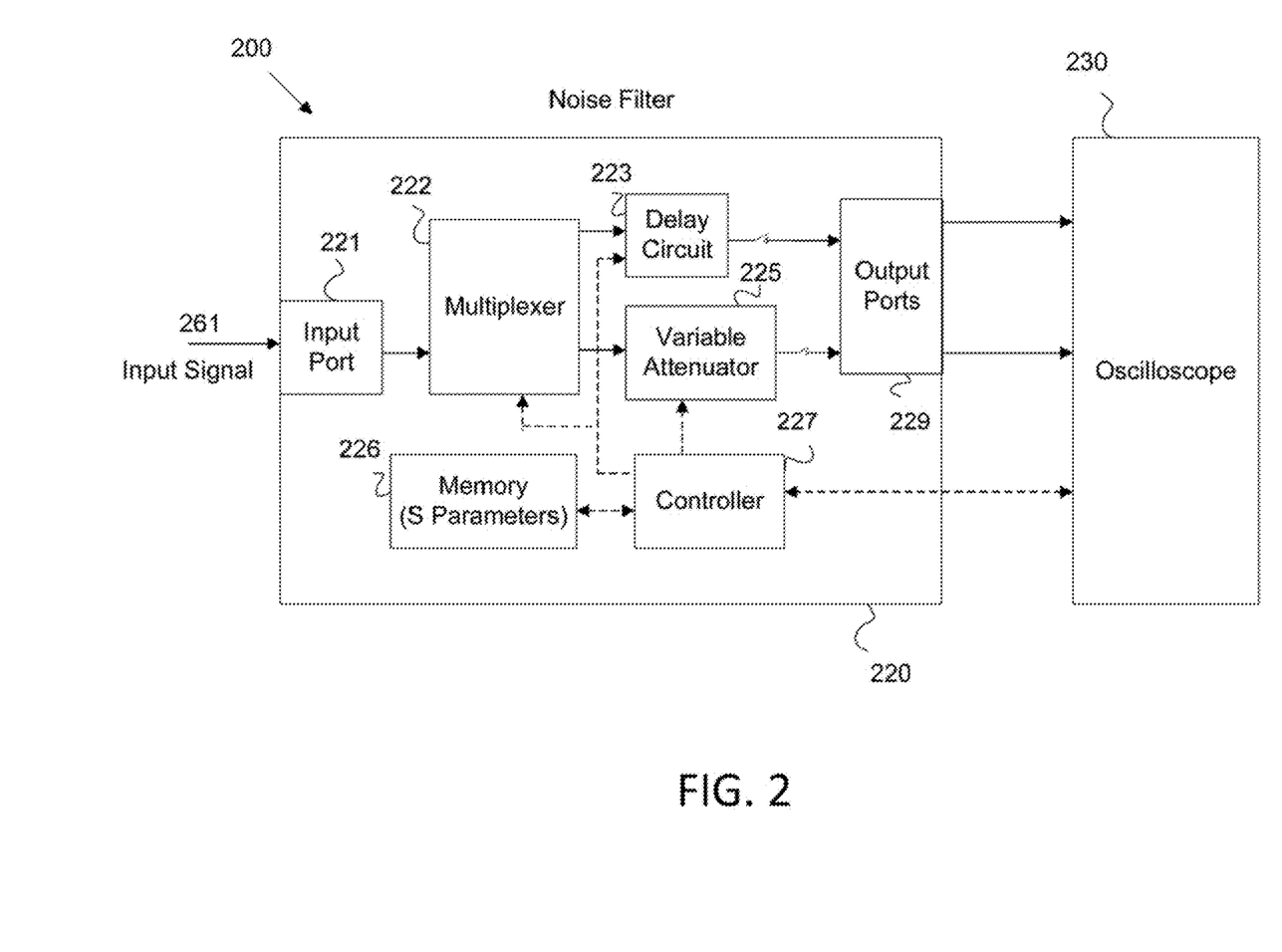
FIG. 2 is a block diagram of an example test and measurement system including a noise filter in accordance with various aspects of the present disclosure.

FIG. 2 is a block diagram of an example test and measurement system 200 including a noise filter 220 coupled to an oscilloscope 230 without employing a combiner. Noise filter 220 is substantially similar to noise filter 120. Noise filter 220 includes an input port 221 for receiving an input signal 261 from a DUT, a multiplexer 222, a delay circuit 223, a variable attenuator 225, a controller 227, and a memory 226, which may be substantially similar to input port 121, input signal 161, multiplexer 122, delay circuit 123, variable attenuator 125, controller 127, and memory 126, respectively. Unlike noise filter 120, noise filter 220 does not contain a combiner. As such, both the high frequency band and the low frequency bands are forwarded as separate signals. The noise filter 220 further comprises a plurality of output ports 229 to output the plurality of frequency bands to the oscilloscope 230. The output ports 229 are substantially similar to the output port 129, but an output port 229 is employed for each band instead of a single port for a combined test signal. As such, the oscilloscope 230 receives both the high frequency band and the low frequency band, as well as any intermediate bands, on separate channels for separate processing by the oscilloscope.

An oscilloscope 230 is a test and measurement device configured to sample one or more test signals and display a waveform and/or sample data corresponding to the test signals to a user for testing and/or analysis purposes. The oscilloscope 230 may contain amplifiers, clock recovery circuits, analog to digital (A/D) converters, and/or other conditioning circuits, memory, processors/controllers, user controls, a display, and/or ports for communicating data. For example, the oscilloscope 230 may receive the high frequency band and low frequency band, convert the bands into waveforms, and display the waveforms for each band to an end user. If employed in system 100, the oscilloscope 230 may perform a similar function on a combined test signal 162. As shown, the oscilloscope 230 may communicate commands to the controller 227 to control the noise filter 220 hardware as desired, for example by employing an external controller in the oscilloscope 230 to send commands to the controller 227.

Figure 3:
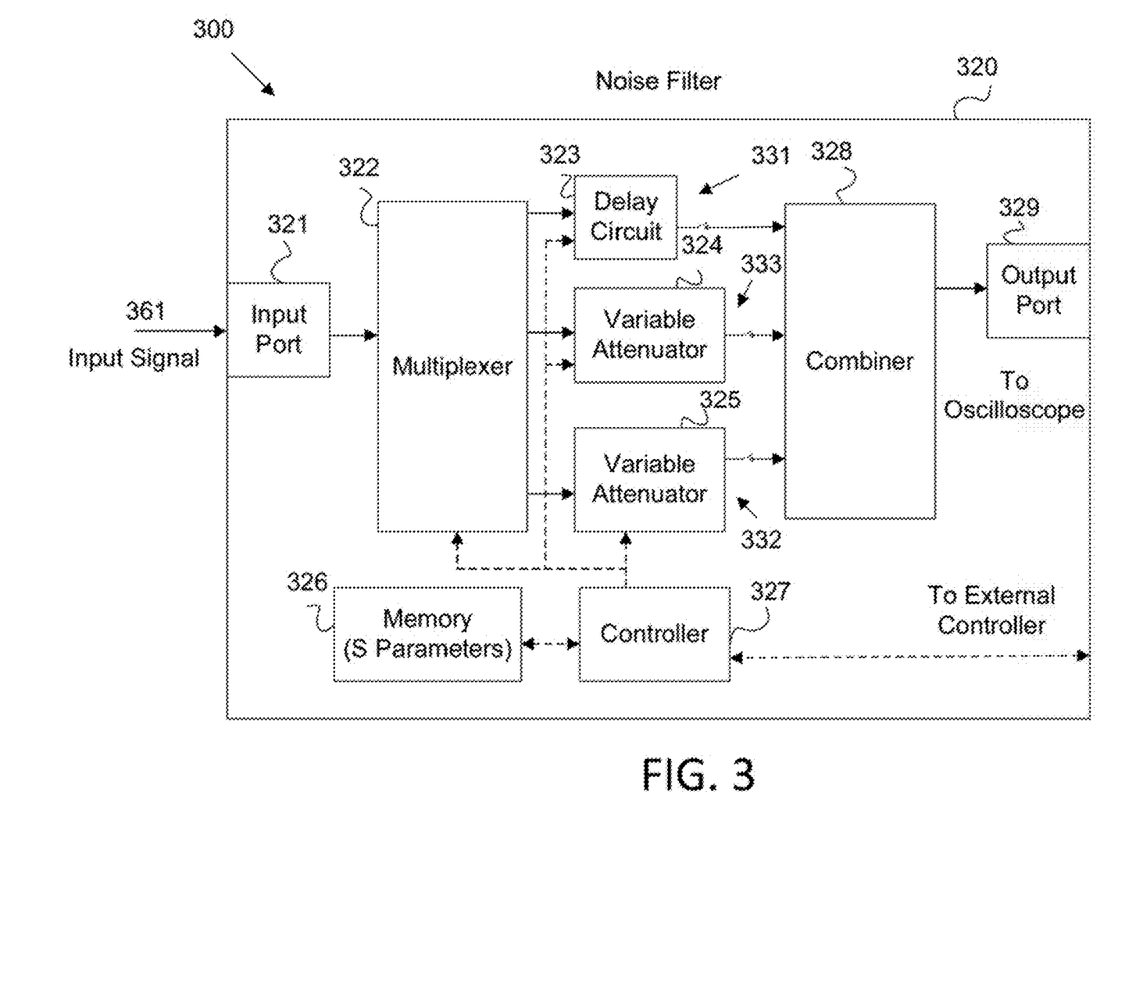
FIG. 3 is a block diagram of an example of a test and measurement system including a noise filter in accordance with various aspects of the present disclosure.

FIG. 3 is a block diagram of an example of a test and measurement system 300 including a noise filter 320 employing a low frequency band, a mid-frequency band, and a high frequency band. Noise filter 320 is substantially similar to noise filter 120. Noise filter 320 includes an input port 321 for receiving an input signal 361 from a DUT, a multiplexer 322, a delay circuit 323 in a high frequency channel 331, a low-band variable attenuator 325 in a low frequency channel 332, a combiner 328, an output port 329, a controller 327, and a memory 326, which may be substantially similar to input port 121, input signal 161, multiplexer 122, delay circuit 123, high frequency channel 131, variable attenuator 125, low frequency channel 132, combiner 128, output port 129, controller 127, and memory 126, respectively.

The noise filter 320 also includes a mid-band variable attenuator 324 positioned in a mid-frequency channel 333, which are similar to low-band variable attenuator 325 and low frequency channel 332, respectively. Multiplexer 322 is configured with two adjustable cross-over frequencies. Frequencies below a first cross-over frequency are forwarded to the low frequency channel 332 and the low-band variable attenuator 325. Frequencies between the first cross-over frequency and the second cross-over frequency are forwarded to the mid-frequency channel 333 and the mid-band variable attenuator 324. Frequencies above the second cross-over frequency are forwarded to the high frequency channel 331 and the delay circuit 323. Accordingly, the noise filter 320 employs a plurality of frequency bands including a low frequency band, a mid-frequency band, and a high frequency band. The mid-band variable attenuator 324 is coupled to the multiplexer 322 and is configured to adjustably attenuate the mid-frequency band relative to the high frequency band to mitigate frequency specific signal loss in the input signal 361. Further, the controller 327 is coupled to the mid-band variable attenuator 324. The controller 327 may also select an attenuation for the mid-band variable attenuator 324 based on characteristics of the input signal 361. Such selection can be performed in a manner similar to the selection of the attenuation for the low-band variable attenuator 325 (e.g. as discussed with respect to variable attenuator 125 in FIG. 1).

By employing three frequency bands, noise filter 320 can more accurately approximate the frequency response of the DUT/DUT link at the cost of a more complex hardware configuration. It should also be noted that additional frequency channels may be added as desired by including additional cross-over frequencies in the multiplexer 322, additional variable attenuators, and additional switches/connections with the combiner 328. It should also be noted that, in some examples, a delay circuit may also be included in the mid-frequency band in addition to or in place of the mid-frequency variable attenuator 324. Additional similarly configured mid-frequency bands can be included depending on the desired configuration.

Figure 4:
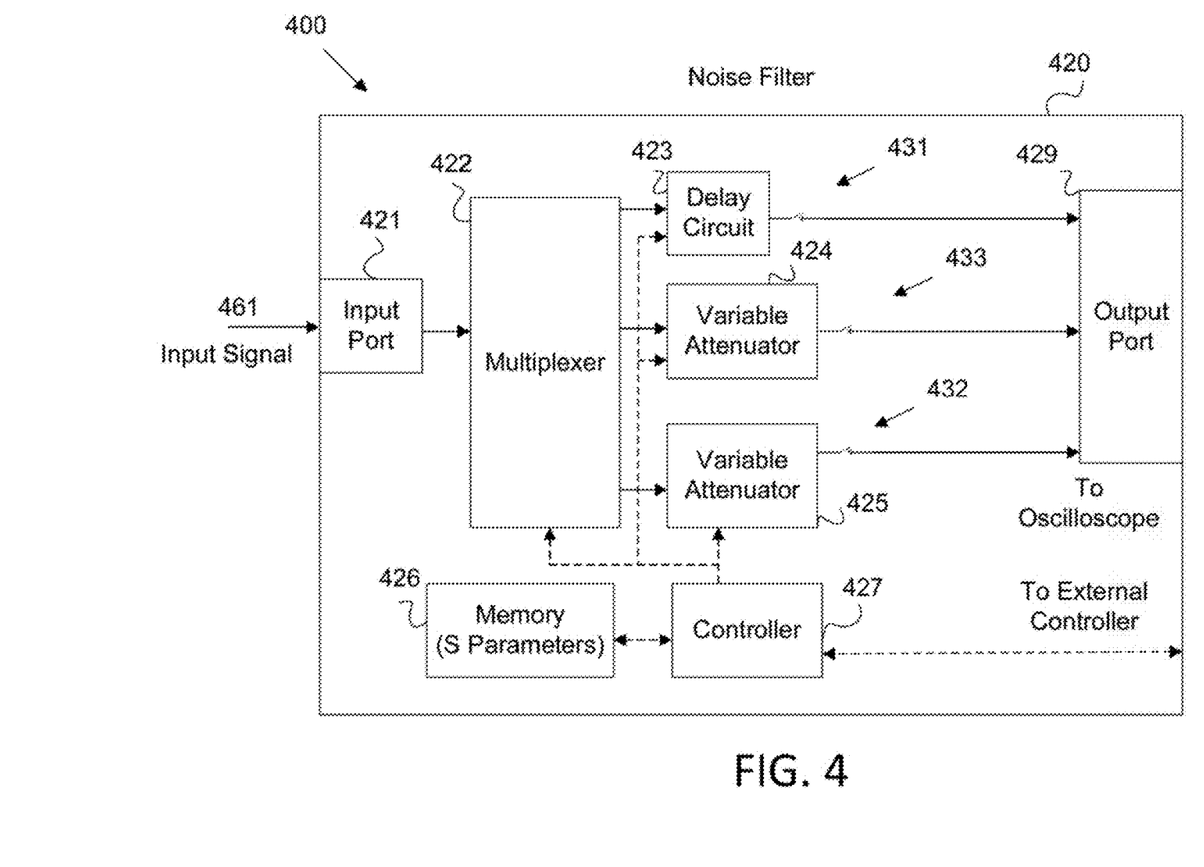
FIG. 4 is a block diagram of an example of a test and measurement system including a noise filter in accordance with various aspects of the present disclosure.

FIG. 4 is a block diagram of an example of a test and measurement system 400 including a noise filter 420 filter employing a low frequency channel 432, a mid-frequency channel 433, and a high frequency channel 431 without employing a combiner. Noise filter 420 may be substantially similar to noise filter 320. Noise filter 420 includes an input port 421 for receiving an input signal 461 from a DUT, a multiplexer 422, a delay circuit 423 in a high frequency channel 431, a mid-band variable attenuator 424 in a mid-frequency channel 433, a low-band variable attenuator 425 in a low frequency channel 432, a controller 427, and a memory 426, which may be substantially similar to input port 321, input signal 361, multiplexer 322, delay circuit 323, high frequency channel 331, mid-band variable attenuator 324, mid-frequency channel 333, low-band variable attenuator 325, low frequency channel 332, controller 327, and memory 326, respectively. Like noise filter 220, noise filter 420 does not contain a combiner. Hence the frequency channels 431, 432, and 433 are coupled directly to output ports 429, which are substantially similar to output ports 229 of noise filter 220. Accordingly, noise filter 420 outputs three frequency bands directly to an oscilloscope via output ports 429 for processing, acquisition, and/or display. As with noise filter 320, noise filter 420 can be modified to add additional frequency channels as desired by adding additional variable attenuators and adding additional cross-over frequencies to the multiplexer 422.

Figure 5:
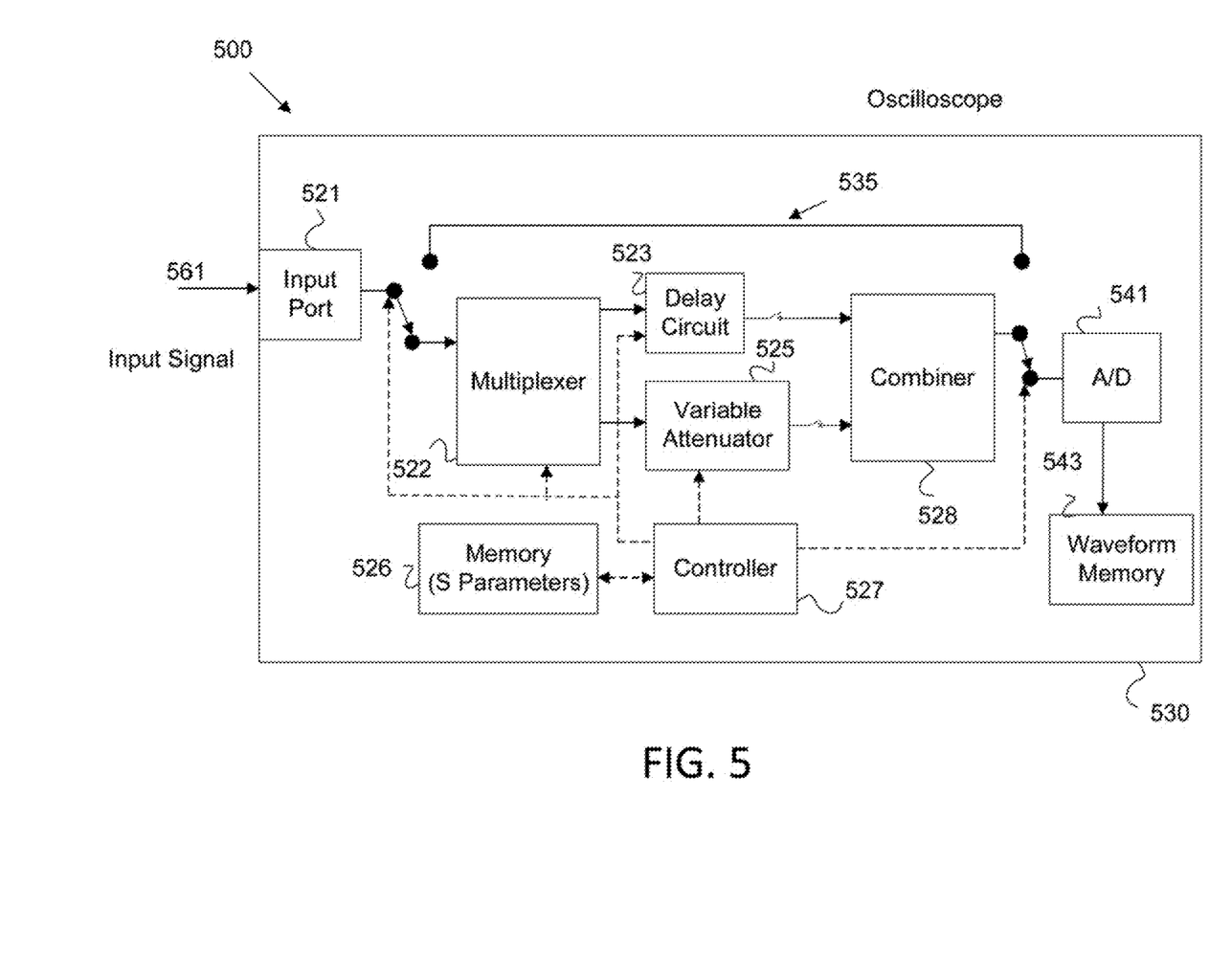
FIG. 5 is a block diagram of an example test and measurement system including a noise filter in accordance with various aspects of the present disclosure.

FIG. 5 is a block diagram of an example test and measurement system 500 including a noise filter implemented in an oscilloscope 530. System 500 is substantially similar to a noise filter 120 contained within an oscilloscope 230. Oscilloscope 530 includes an input port 521 for receiving an input signal 561 from a DUT, a multiplexer 522, a delay circuit 523, a variable attenuator 525, a combiner 528, a controller 527, and memory 526, which may be substantially similar to input port 121, multiplexer 122, delay circuit 123, variable attenuator 125, combiner 128, controller 127, and memory 126, respectively.

As depicted, oscilloscope 530 also includes an optional bypass channel 535. The bypass channel 535 is controllable by the controller 527 to allow the input signal 561 to bypass the noise filter circuitry as desired based on user input, or other control input. The bypass channel 535 can be beneficial when the noise filter circuitry may not provide a benefit, for example, when the input signal 561 is from a lossless channel. For example, applying a noise filter to a lossless signal may result in an attenuation overshoot, which may reduce the final signal-to-noise ratio rather than increasing it as desired. The benefit provided by the noise filter can be dependent upon the signal spectrum shape of the input signal 561. As such, the noise filter circuitry can be bypassed when no benefit is provided, and switched in when benefit is provided.

The oscilloscope 530 also includes an analog to digital (A/D) converter 541 and a waveform memory 543. The A/D converter 531 is positioned along a signal channel for the combined signal and configured to convert the test signal from the combiner from an analog signal into a digital signal that is a digital representation of the analog signal. For example, the A/D converter may include a sampler that samples the analog signal at discrete instants in time. The samples are then stored in the waveform memory 543. The samples from the waveform memory 543 may then be employed to depict waveforms corresponding to the input signal 561 on a display. Accordingly, the A/D converter 541 is configured to convert an analog signal from an analog domain into to a digital signal in a digital domain for storage in the waveform memory 543. It should be noted that the oscilloscope 530 may contain additional components for de-embedding, signal conditioning, user controls, etc., that are not discussed for the sake of brevity, but are understood by one of skill in the art. It should also be noted that additional bypass circuits may also be employed to switch out the combiner 528 to allow sampling of each frequency band individually as desired.

Figure 6:
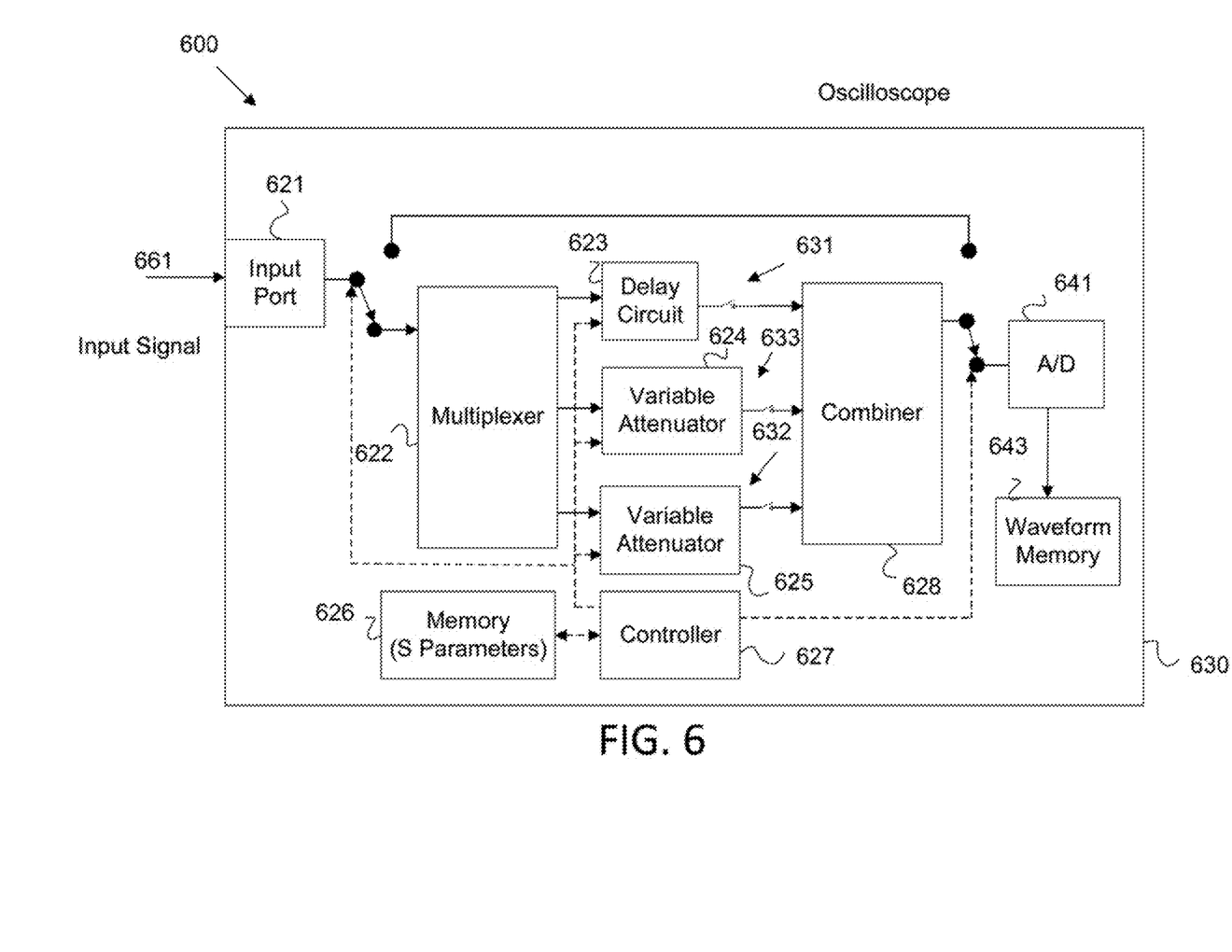
FIG. 6 is a block diagram of an example test and measurement system including a noise filter implemented in accordance with various aspects of the present disclosure.

FIG. 6 is a block diagram of an example test and measurement system 600 including a noise filter implemented in an oscilloscope 630 and employing a low frequency channel 632, a mid-frequency channel 633, and a high frequency channel 631. System 600 is substantially similar to a noise filter 320 contained within an oscilloscope 230. Oscilloscope 630 includes an input port 621 for receiving an input signal 661 from a DUT, a multiplexer 622, a delay circuit 623 in a high frequency channel 631, a mid-band variable attenuator 624 in a mid-frequency channel 633, a low-band variable attenuator 625 in a low frequency channel 632, a combiner 628, a controller 627, and a memory 626, which may be substantially similar to input port 321, input signal 361, multiplexer 322, delay circuit 323, high frequency channel 331, mid-band variable attenuator 324, mid-frequency channel 333, low-band variable attenuator 325, low frequency channel 332, combiner 328, controller 327, and memory 326, respectively. The oscilloscope 630 also includes an A/D converter 641 and a waveform memory 643, which may be substantially similar to A/D converter 541 and waveform memory 543, respectively. As such, oscilloscope 630 splits the input signal 661 into three bands, attenuates the low and mid-frequency bands to mitigate frequency specific attenuation, combines the signal into a test signal, and samples the test signal at the A/D converter 641 for storage at the waveform memory 643. The samples from the waveform memory 643 may then be employed to depict waveforms corresponding to the input signal 661 on a display. As discussed above with respect to noise filters 320 and 420, oscilloscope 630 may include additional frequency channels as desired by adding additional variable attenuators and cross-over frequencies in the multiplexer 622. It should be noted that the oscilloscope 630 may contain additional components for de-embedding, signal conditioning, user controls, etc., that are not discussed for the sake of brevity, but are understood by one of skill in the art. It should also be noted that additional bypass circuits may also be employed to switch out the combiner 628 to allow sampling of each frequency band individually as desired.

Figure 7:
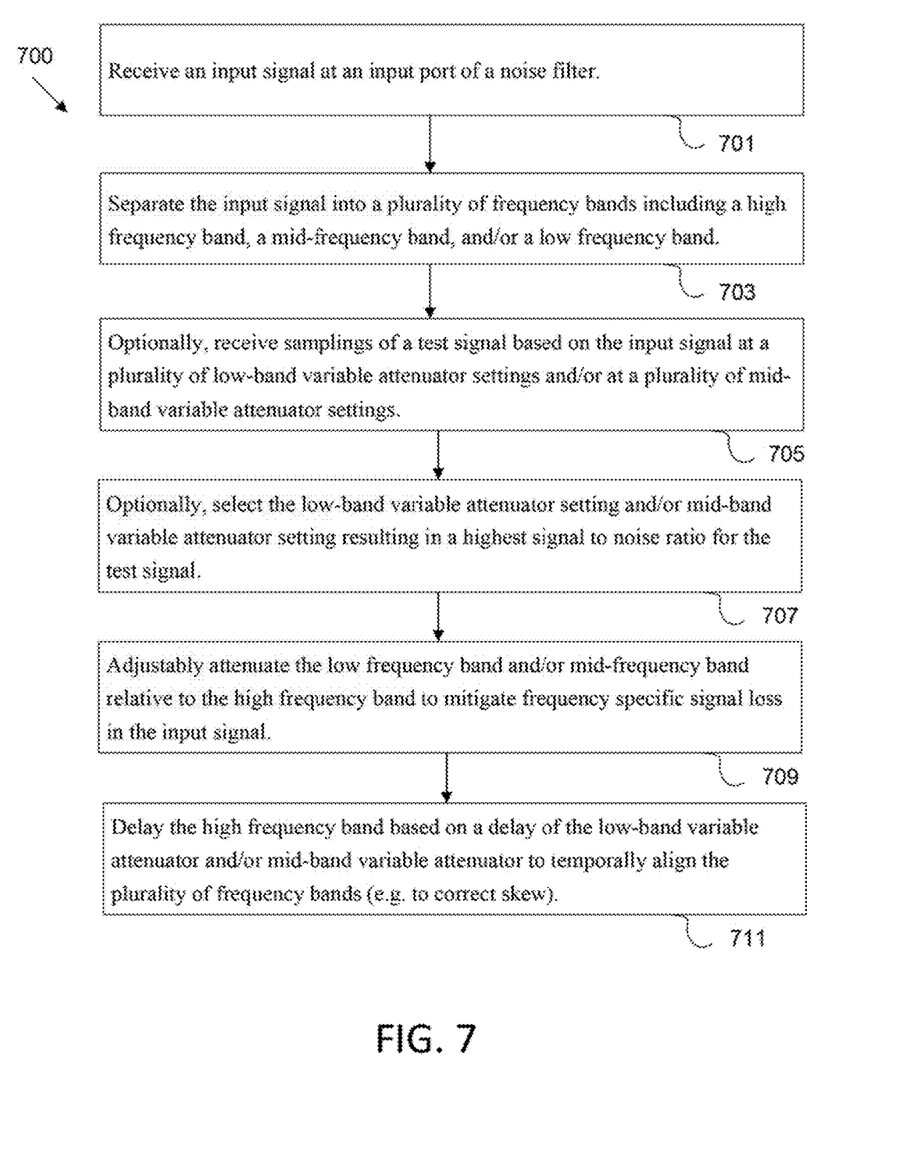
FIG. 7 is a flowchart of an example method for employing a noise filter in accordance with various aspects of the present disclosure.

FIG. 7 is a flowchart of an example method 700 for employing a noise filter to mitigate frequency specific signal loss. For example, method 700 may be implemented by noise filters 120, 220, 320, 420, an external oscilloscope, oscilloscope 530, oscilloscope 630, and/or combinations thereof. The method 700 may also be implemented as instructions stored in memory and executed by a controller in a noise filter and/or oscilloscope.

At block 701, an input signal is received at an input port of a noise filter and/or at an input port of a noise filter contained in an oscilloscope. At block 703, the input signal is separated into a plurality of frequency bands, for example via a multiplexer. Depending on the example the plurality of frequency bands may include a high frequency band, one or more mid-frequency bands, and/or a low frequency band.

At optional block 705, samplings of a test signal may be forwarded to a test instrument. The samplings may be based on the input signal at a plurality of low-band variable attenuator settings and/or at a plurality of mid-band variable attenuator settings. In other words, a high frequency band sample may be forwarded to a test instrument. Mid-frequency band samples may also be forwarded to the test instrument for each possible mid-band variable attenuator setting. Low frequency band samples may also be forwarded to the test instrument for each possible low band variable attenuator setting.

At optional block 707, the low-band variable attenuator setting and/or mid-band variable attenuator setting resulting in a highest signal-to-noise ratio for the test signal may be selected. It should be noted that optional blocks 705 and 707 may be replaced, in some examples, with a process that selects a low-band variable attenuator setting based on S parameters and/or direct user control.

At block 709, the low frequency band and/or mid-frequency band are adjustably attenuated relative to the high frequency band to mitigate frequency specific signal loss in the input signal. For example, the attenuation may be accomplished by a low-band variable attenuator and/or a mid-band variable attenuator in a low frequency channels and/or a mid-frequency channel, respectively.

At block 711, the high frequency band may be delayed based on a delay of the low-band variable attenuator and/or mid-band variable attenuator to temporally align the plurality of frequency bands (e.g. to correct skew).

Figure 8:
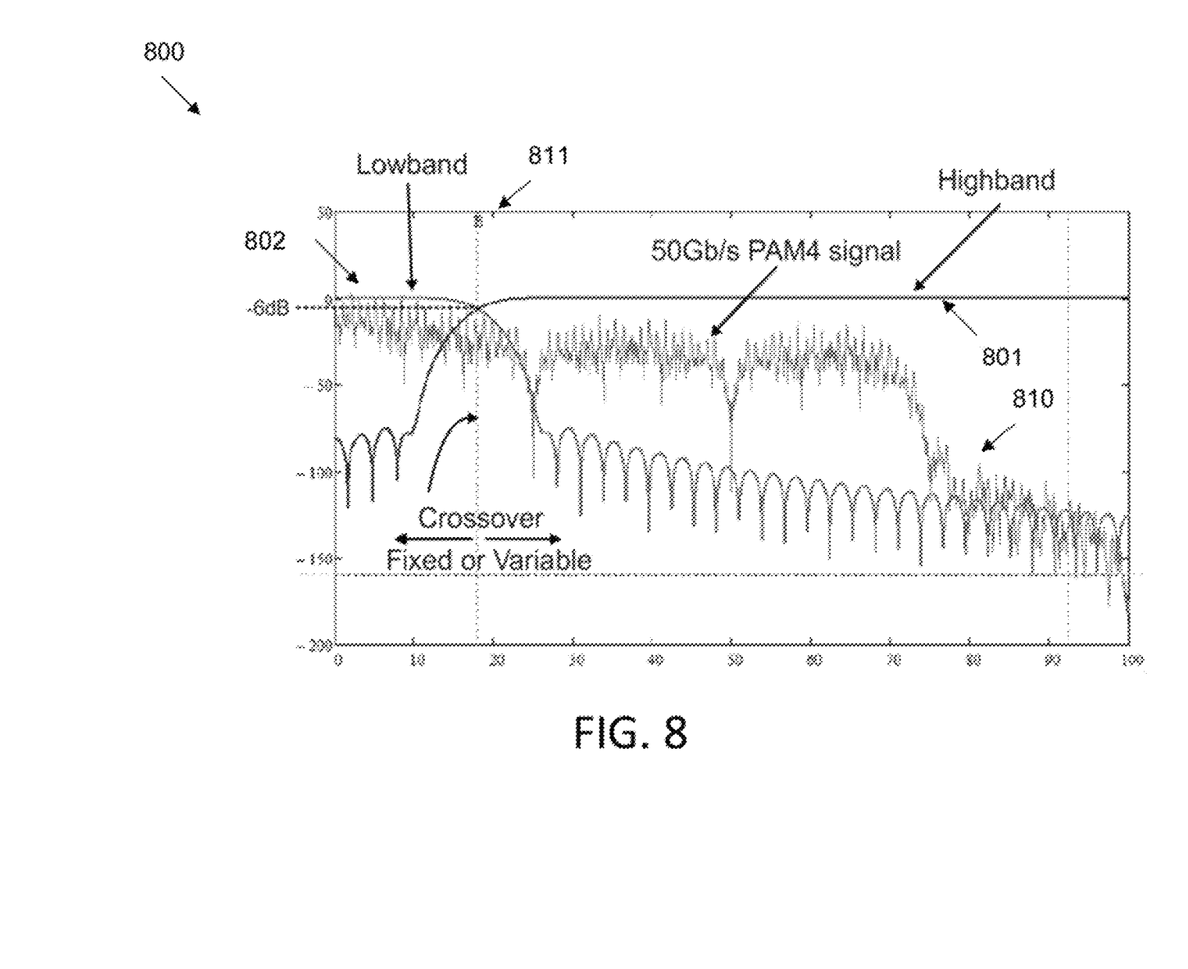
FIG. 8 is a graph of an example dual band noise filter frequency response in accordance with various aspects of the present disclosure.

FIG. 8 is a graph 800 of an example dual band noise filter frequency response, for example as provided by a noise filter 120, 220, and/or oscilloscope 530. The graph 800 depicts frequency in the horizontal axis in units of gigahertz (GHz) and signal magnitude in the vertical axis in units of decibels (dB). Graph 800 depicts an input signal 810 received from a DUT. In this example, the input signal 810 is a fifty gigabits per second (Gb/s) pulse amplitude modulation version four (PAM4) signal. The graph 800 also depicts a high band 801 frequency response and a low band 802 frequency response corresponding to a high frequency channel and a low frequency channel, respectively. Further, the graph 800 depicts an example cross-over frequency 811. As shown, the low band 802 response allows the input signal 810 below the cross-over frequency 811 through the low band channel to the attenuator without modification while attenuating portions of the signal with a frequency above the cross-over frequency 811. Likewise, the high band 801 response allows the input signal 810 above the cross-over frequency 811 through the low band channel to the attenuator without modification while significantly attenuating portions of the signal with a frequency below the cross-over frequency 811.

It should also be noted that the frequency response of the high band 801 is flat at high frequencies while the frequency response of the low band 802 is flat at low frequencies. The flat bands over the bandwidth offer a larger amount of noise reduction compared to having a response sloped across a band. When used with an inverse noise filter after an oscilloscope digitizer output, the total noise added by the oscilloscope is reduced by a larger overall amount when de-embedding the noise filter frequency response.

Figure 9:
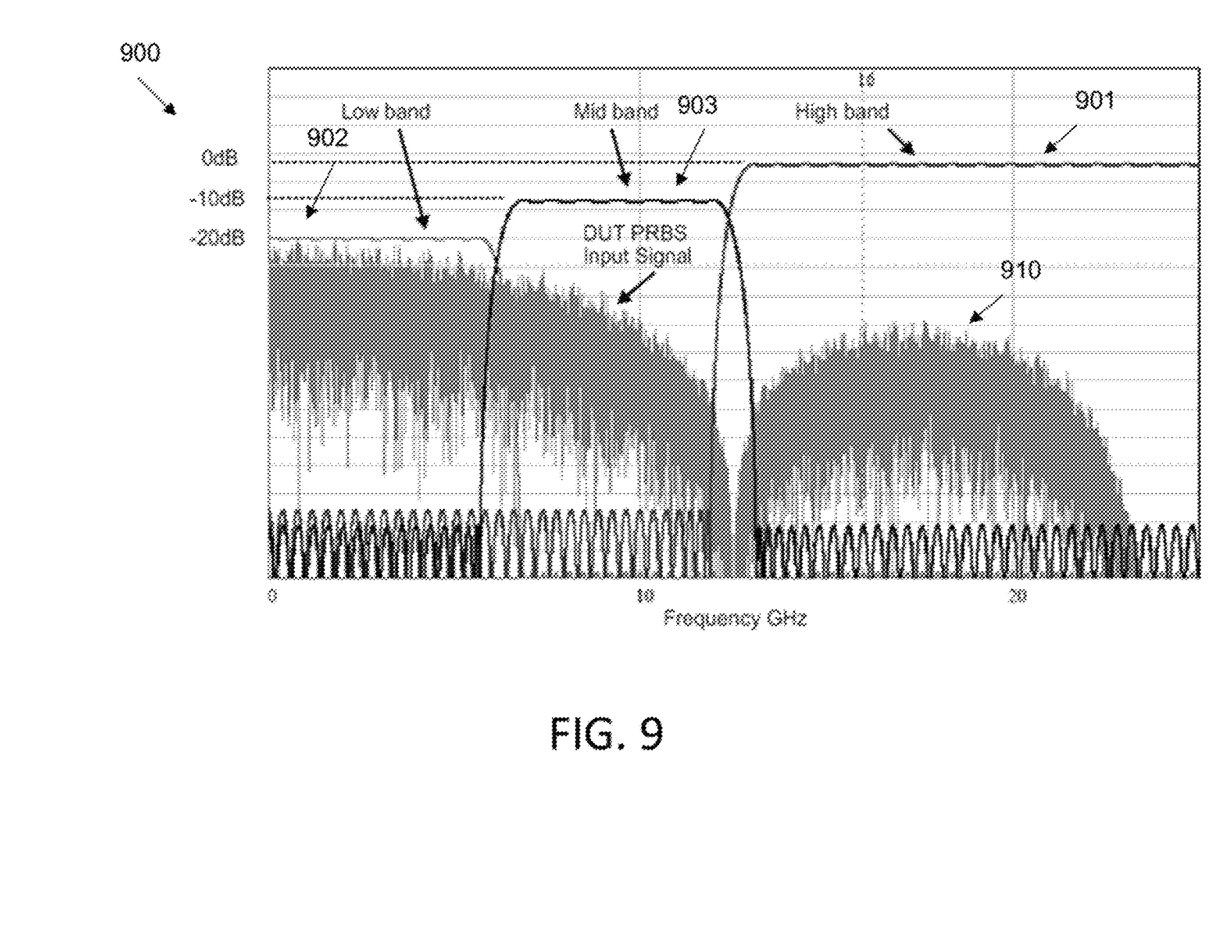
FIG. 9 is a graph of an example three band noise filter frequency response in accordance with various embodiments of the present disclosure.

FIG. 9 is a graph 900 of an example three band noise filter frequency response, for example as provided by a noise filter 320, 420, and/or oscilloscope 630. The graph 900 depicts frequency in the horizontal axis in units of gigahertz (GHz) and signal magnitude in the vertical axis in units of decibels (dB). Graph 900 depicts an input signal 910 received from a DUT. In this example, the input signal 910 is a pseudorandom binary sequence (PRBS) signal. The graph 900 also depicts a high band 901 frequency response, a mid-band 903 frequency response, and a low band 902 frequency response corresponding to a high frequency channel and a low frequency channel, respectively. As with graph 800, each band maintains a relatively flat response as bounded by corresponding cross-over frequencies and attenuates outside of the corresponding cross-over frequencies. Such flat responses provide significant noise reduction at the corresponding oscilloscope.

Examples of the disclosure may operate on a particularly created hardware, on firmware, digital signal processors, or on a specially programmed computer including a processor operating according to programmed instructions. The terms "controller" or "processor" as used herein are intended to include microprocessors, microcomputers, ASICs, and dedicated hardware controllers. One or more aspects of the disclosure may be embodied in computer-usable data and computer-executable instructions, such as in one or more program modules, executed by one or more computers (including monitoring modules), or other devices. Generally, program modules include routines, programs, objects, components, data structures, etc. that perform particular tasks or implement particular abstract data types when executed by a processor in a computer or other device. The computer executable instructions may be stored on a computer readable medium such as a hard disk, optical disk, removable storage media, solid state memory, RAM, etc. As will be appreciated by one of skill in the art, the functionality of the program modules may be combined or distributed as desired in various examples. In addition, the functionality may be embodied in whole or in part in firmware or hardware equivalents such as integrated circuits, field programmable gate arrays (FPGA), and the like. Particular data structures may be used to more effectively implement one or more aspects of the disclosure, and such data structures are contemplated within the scope of computer executable instructions and computer-usable data described herein.

Aspects of the present disclosure operate with various modifications and in alternative forms. Specific aspects have been shown by way of example in the drawings and are described in detail herein below. However, it should be noted that the examples disclosed herein are presented for the purposes of clarity of discussion and are not intended to limit the scope of the general concepts disclosed to the specific examples described herein unless expressly limited. As such, the present disclosure is intended to cover all modifications, equivalents, and alternatives of the described aspects in light of the attached drawings and claims.

References in the specification to embodiment, aspect, example, etc., indicate that the described item may include a particular feature, structure, or characteristic. However, every disclosed aspect may or may not necessarily include that particular feature, structure, or characteristic. Moreover, such phrases are not necessarily referring to the same aspect unless specifically noted. Further, when a particular feature, structure, or characteristic is described in connection with a particular aspect, such feature, structure, or characteristic can be employed in connection with another disclosed aspect whether or not such feature is explicitly described in conjunction with such other disclosed aspect.

The disclosed aspects may be implemented, in some cases, in hardware, firmware, software, or any combination thereof. The disclosed aspects may also be implemented as instructions carried by or stored on one or more computer-readable media, which may be read and executed by one or more processors. Such instructions may be referred to as a computer program product. Computer-readable media, as discussed herein, means any media that can be accessed by a computing device. By way of example, and not limitation, computer-readable media may comprise computer storage media and communication media.

Computer storage media means any medium that can be used to store computer-readable information. By way of example, and not limitation, computer storage media may include Random Access Memory (RAM), Read Only Memory (ROM), Electrically Erasable Programmable Read-Only Memory (EEPROM), flash memory or other memory technology, Compact Disc Read Only Memory (CD-ROM), Digital Video Disc (DVD), or other optical disk storage, magnetic cassettes, magnetic tape, magnetic disk storage or other magnetic storage devices, and any other volatile or nonvolatile, removable or non-removable media implemented in any technology. Computer storage media excludes signals per se and transitory forms of signal transmission.

Communication media means any media that can be used for the communication of computer-readable information. By way of example, and not limitation, communication media may include coaxial cables, fiber-optic cables, air, or any other media suitable for the communication of electrical, optical, Radio Frequency (RF), infrared, acoustic or other types of signals.

EXAMPLES

Illustrative examples of the technologies disclosed herein are provided below. An embodiment of the technologies may include any one or more, and any combination of, the examples described below.

Example 1 includes a noise filter comprising: an input port to receive an input signal; a multiplexer, coupled to the input port, to separate the input signal into a plurality of frequency bands including a high frequency band and a low frequency band; and a low-band variable attenuator, coupled to the multiplexer, to adjustably attenuate the low frequency band relative to the high frequency band.

Example 2 includes the noise filter of Example 1, further comprising a combiner to re-combine the plurality of frequency bands into a single test signal for sampling by a test and measurement instrument.

Example 3 includes the noise filter of Examples 1-2, further comprising a controller, coupled to the low-band variable attenuator, the controller to select an attenuation for the low-band variable attenuator based on characteristics of the input signal.

Example 4 includes the noise filter of Examples 1-3, wherein the plurality of frequency bands includes a mid-frequency band, and wherein the noise filter further includes a mid-band variable attenuator, coupled to the multiplexer, to adjustably attenuate the mid-frequency band relative to the high frequency band.

Example 5 includes the noise filter of Example 4, wherein the controller is coupled to the mid-band variable attenuator, and the controller is further to select an attenuation for the mid-band variable attenuator based on characteristics of the input signal.

Example 6 includes the noise filter of Examples 1-5, wherein the controller selects an attenuation for the low-band variable attenuator according to received samplings of a test signal based on the input signal at a plurality of low-band variable attenuator settings, the attenuation selected as the low-band variable attenuator setting with a highest signal-to-noise ratio for the test signal.

Example 7 includes the noise filter of Examples 1-6, further comprising a memory to store scattering (S) parameters, wherein the controller selects an attenuation for the low-band variable attenuator based on the S-parameters.

Example 8 includes the noise filter of Examples 1-7, further comprising a delay circuit, positioned in a high frequency channel, to temporally align the high frequency band with the low frequency band prior to recombination into a single test signal.

Example 9 includes the noise filter of Examples 1-8, wherein the noise filter is contained within an oscilloscope.

Example 10 includes the noise filter of Examples 1-9, further comprising a plurality of output ports to output the plurality of frequency bands to an oscilloscope.

Example 11 includes the noise filter of Examples 1-10, further comprising a high-band variable attenuator, coupled to the multiplexer, to adjustably attenuate the high frequency band.

Example 12 includes a method comprising: receiving, at an input port of a noise filter, an input signal; separating, at a multiplexer of the noise filter, the input signal into a plurality of frequency bands including a high frequency band and a low frequency band; and adjustably attenuating, at a low-band variable attenuator of the noise filter, the low frequency band relative to the high frequency band.

Example 13 includes the method of Example 12, wherein the plurality of frequency bands includes a mid-frequency band, and further comprising adjustably attenuating, at a mid-band variable attenuator of the noise filter, the mid-frequency band relative to the high frequency band.

Example 14 includes the method of Examples 12-13, wherein adjustably attenuating the low frequency band relative to the high frequency band includes: receiving samplings of a test signal based on the input signal at a plurality of low-band variable attenuator settings; and selecting the low-band variable attenuator setting resulting in a highest signal-to-noise ratio for the test signal.

Example 15 includes the method of Examples 12-14, wherein adjustably attenuating the low frequency band relative to the high frequency band includes selecting a low-band variable attenuator setting based on scattering (S) parameters.

Example 16 includes the method of Examples 12-15, further comprising delaying the high frequency band based on a delay of the low-band variable attenuator to temporally align the plurality of frequency bands.

Example 17 includes a computer readable storage medium having instructions stored thereon that, when executed by a processor of a noise filter, cause the noise filter to: receive, at an input port, an input signal; separate, at a multiplexer, the input signal into a plurality of frequency bands including a high frequency band and a low frequency band; and adjustably attenuate, at a low-band variable attenuator, the low frequency band relative to the high frequency band.

Example 18 includes the computer readable storage medium of Example 17, wherein the plurality of frequency bands includes a mid-frequency band, and wherein the instructions further cause the noise filter to adjustably attenuate, at a mid-band variable attenuator, the mid-frequency band relative to the high frequency band.

Example 19 includes the computer readable storage medium of Examples 17-18, wherein the instructions further cause the noise filter to: receive samplings of a test signal based on the input signal at a plurality of low-band variable attenuator settings; and select the low-band variable attenuator setting resulting in a highest signal-to-noise ratio for the test signal.

Example 20 includes the computer readable storage medium of Examples 17-19, wherein the instructions further cause the noise filter to delay, at a delay circuit, the high frequency band based on a delay of the low-band variable attenuator to temporally align the plurality of frequency bands.

The previously described examples of the disclosed subject matter have many advantages that were either described or would be apparent to a person of ordinary skill. Even so, all of these advantages or features are not required in all versions of the disclosed apparatus, systems, or methods.

Additionally, this written description makes reference to particular features. It is to be understood that the disclosure in this specification includes all possible combinations of those particular features. Where a particular feature is disclosed in the context of a particular aspect or example, that feature can also be used, to the extent possible, in the context of other aspects and examples.

Also, when reference is made in this application to a method having two or more defined steps or operations, the defined steps or operations can be carried out in any order or simultaneously, unless the context excludes those possibilities.

Although specific examples of the disclosure have been illustrated and described for purposes of illustration, it will be understood that various modifications may be made without departing from the spirit and scope of the disclosure. Accordingly, the disclosure should not be limited except as by the appended claims.

We claim:

1. A noise filter comprising:
an input port to receive an analog signal;
a multiplexer, coupled to the input port, to separate the analog signal into a plurality of frequency bands including a high frequency band that includes a higher frequency portion of the analog signal and a low frequency band that includes a lower frequency portion of the analog signal; and
a low-band variable attenuator, coupled to the multiplexer, to adjustably attenuate the low frequency band relative to the high frequency band to mitigate noise in the high frequency band.

2. The noise filter of claim 1, further comprising a combiner to re-combine the plurality of frequency bands into a single test signal for sampling by a test and measurement instrument.

3. The noise filter of claim 1, further comprising a controller, coupled to the low-band variable attenuator, the controller to select an attenuation for the low-band variable attenuator based on characteristics of the analog signal.

4. The noise filter of claim 3, wherein the plurality of frequency bands includes a mid-frequency band that includes a frequency portion of the analog signal that is between the higher frequency portion and the lower frequency portion of the signal, and wherein the noise filter further includes a mid-band variable attenuator, coupled to the multiplexer, to adjustably attenuate the mid-frequency band relative to the high frequency band to mitigate noise in the analog signal.

5. The noise filter of claim 4, wherein the controller is coupled to the mid-band variable attenuator, and the controller is further to select an attenuation for the mid-band variable attenuator based on characteristics of the analog signal.

6. The noise filter of claim 3, wherein the controller selects attenuation settings for the low-band variable attenuator according to received samplings of a test signal based on the analog signal to increase a signal-to-noise ratio for a digital signal produced from the test signal.

7. The noise filter of claim 3, further comprising a memory to store scattering (S) parameters, wherein the controller selects an attenuation for the low-band variable attenuator based on the S-parameters.

8. The noise filter of claim 1, further comprising a delay circuit applied to the high frequency band to temporally align the high frequency band with the low frequency band after the low-band variable attenuator.

9. The noise filter of claim 1, wherein the noise filter is contained within an oscilloscope.

10. The noise filter of claim 1, further comprising a plurality of output ports to output the plurality of frequency bands to an oscilloscope.

11. The noise filter of claim 1, further comprising a high-band variable attenuator, coupled to the multiplexer, to adjustably attenuate the high frequency band.

12. A method comprising:
receiving, at an input port of a noise filter, an analog signal;
separating, at a multiplexer of the noise filter, the analog signal into a plurality of frequency bands including a high frequency band and a low frequency band; and
adjustably attenuating, at a low-band variable attenuator of the noise filter, the low frequency band relative to the high frequency band to mitigate signal loss in the analog signal.

13. The method of claim 12, wherein the plurality of frequency bands includes a mid-frequency band, and further comprising adjustably attenuating, at a mid-band variable attenuator of the noise filter, the mid-frequency band relative to the high frequency band.

14. The method of claim 12, wherein adjustably attenuating the low frequency band relative to the high frequency band includes:
receiving samplings of a test signal based on the analog signal at a plurality of low-band variable attenuator settings; and
selecting the low-band variable attenuator setting resulting in a highest signal-to-noise ratio for the test signal.

15. The method of claim 12, wherein adjustably attenuating the low frequency band relative to the high frequency band includes selecting a low-band variable attenuator setting based on scattering (S) parameters.

16. The method of claim 12, further comprising delaying the high frequency band based on a delay of the low-band variable attenuator to temporally align the plurality of frequency bands.

17. A computer readable storage medium having instructions stored thereon that, when executed by a processor of a noise filter, cause the noise filter to:
separate the analog signal into a plurality of frequency bands including a high frequency band and a low frequency band; and
adjustably attenuate the low frequency band relative to the high frequency band to mitigate noise in the input signal.

18. The computer readable storage medium of claim 17, wherein the plurality of frequency bands includes a mid-frequency band, and wherein the instructions further cause the noise filter to adjustably attenuate the mid-frequency band relative to the high frequency band.

19. The computer readable storage medium of claim 17, wherein the instructions further cause the noise filter to:
receive samplings of a test signal based on the analog signal at a plurality of low-band variable attenuator settings; and select the low-band variable attenuator setting resulting in a highest signal-to-noise ratio for the test signal.

20. The computer readable storage medium of claim 17, wherein the instructions further cause the noise filter to delay the high frequency band based on a delay of the low-band variable attenuator to temporally align the plurality of frequency bands.

\* \* \* \* \*